United States Patent
Ellis et al.

(10) Patent No.: US 6,252,806 B1
(45) Date of Patent: Jun. 26, 2001

(54) MULTI-GENERATOR, PARTIAL ARRAY $V_T$ TRACKING SYSTEM TO IMPROVE ARRAY RETENTION TIME

(75) Inventors: Wayne F. Ellis, Jericho, VT (US); Louis L. Hsu; Brian L. Ji, both of Fishkill, NY (US); Yujon Li, Poughkeepsie, NY (US); Oliver Weinfurtner, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/579,749

(22) Filed: May 26, 2000

(51) Int. Cl.$^7$ .................................................. G11C 16/04
(52) U.S. Cl. .............................. 365/189.09; 365/185.18; 365/227
(58) Field of Search ........................ 365/189.09, 185.18, 365/227

(56) References Cited

U.S. PATENT DOCUMENTS

| | | | |
|---|---|---|---|
| 4,752,699 | * 6/1988 | Cranford, Jr. et al. | 307/297 |
| 4,791,613 | 12/1988 | Hardee | 365/189 |
| 5,006,974 | * 4/1991 | Kazerounian et al. | 363/60 |
| 5,120,993 | * 6/1992 | Tsay et al. | 307/296.4 |
| 5,220,534 | * 6/1993 | Redwine et al. | 365/226 |
| 5,424,985 | 6/1995 | McClure et al. | 365/194 |
| 5,465,232 | 11/1995 | Ong et al. | 365/189.05 |
| 5,753,551 | 5/1998 | Sung | 438/253 |
| 6,016,072 | 1/2000 | Ternullo, Jr. et al. | 327/535 |
| 6,049,495 | 4/2000 | Hsu et al. | 365/203 |
| 6,055,186 | * 4/2000 | Hung et al. | 365/185.18 |
| 6,108,246 | * 8/2000 | Umezawa et al. | 365/189.09 |

FOREIGN PATENT DOCUMENTS

| 10302464 | 2/1997 | (JP) . |
|---|---|---|
| 07111317 | 3/1998 | (JP) . |

OTHER PUBLICATIONS

IBM TDB vol. 32, No. 4A Sep 1989; N–Well Bias Regulator Circuit for CMOS Dynamic Memories by Y. Sakue and R. Scheuerlein.

* cited by examiner

Primary Examiner—Richard Elms
Assistant Examiner—Tuan T. Nguyen
(74) Attorney, Agent, or Firm—Steven Capella (57) ABSTRACT

Improved transistor array device performance is obtained by use of bias voltage regulation which tracks with a fraction of a monitor transistor threshold voltage. The circuitry and methods are especially useful for improving the performance of transistor array devices such as DRAM and embedded DRAM. These benefits are obtained especially when at least two bias voltages normally supplied to the array are regulated by tracking with a fraction of an actual threshold voltage of at least one monitor transistor. Performance improvements include improved reliability, wider operational bias conditions, reduced power consumption and (in the case of memory cells) improved retention time.

29 Claims, 4 Drawing Sheets

MULTI-GENERATOR, PARTIAL ARRAY $V_T$ TRACKING SYSTEM TO IMPROVE ARRAY RETENTION TIME

BACKGROUND OF THE INVENTION

High density dynamic random access memory (DRAM) products and integrated circuit products typically employ transistor arrays. The reliable-management of the electrical environment of these arrays becomes increasingly challenging with the increase in number and density (decreased channel length and channel width) of memory array devices. The electrical environment of the array devices is naturally important to the ability of the devices to be operated for their intended purpose, e.g., in the case of a memory array, writing, reading and retaining data in the individual cells of the array.

Figure 1:
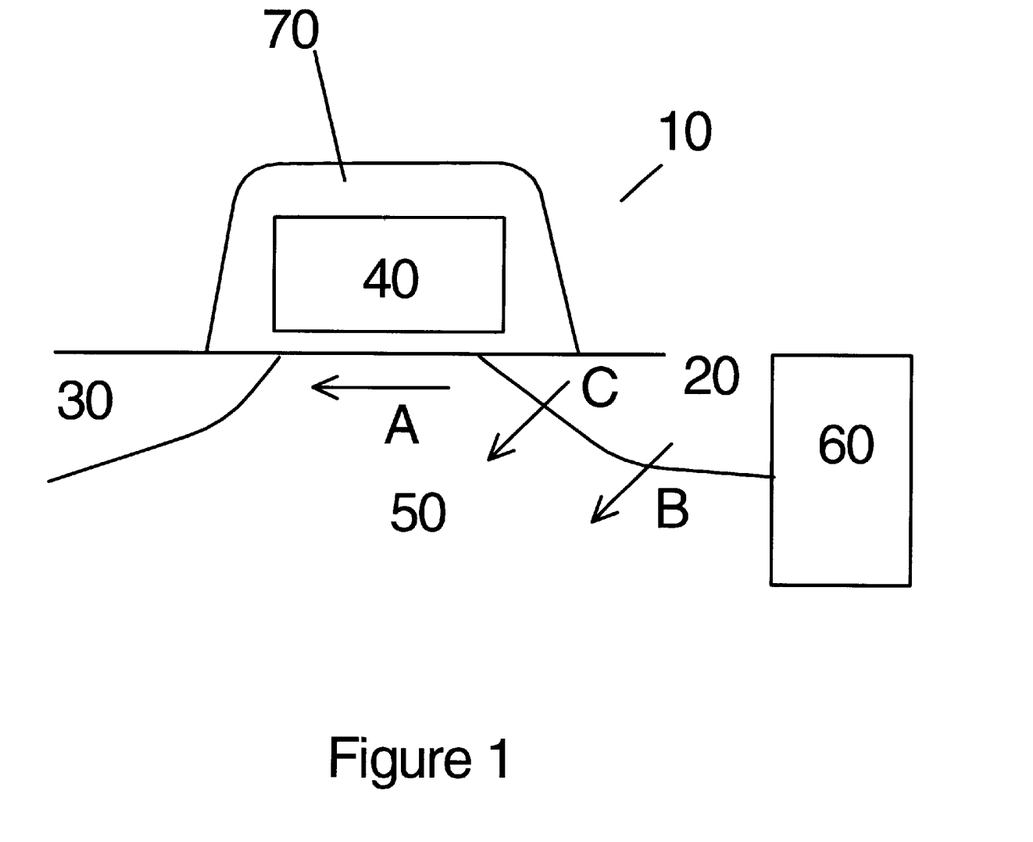
FIG. 1 is a schematic cross section view of a memory cell transistor.

As shown in FIG. 1, a typical DRAM memory cell of a memory array contains an FET transfer transistor 10 which interfaces with a charge storage device (capacitor) 60 which stores the data state of the cell. The array transfer transistor 10 typically has a gate 40 (in the case of DRAM connected to a word line) which is passivated by a dielectric insulator 70. The drain 20 of array transfer transistor 10 acts as a path to charge storage device 60. Source 30 of array transfer transistor 10 acts as a bit line contact path (e.g., a path to allow sensing of the voltage in capacitor 60). Drain 20 and source 30 are separated by well (or body) 50.

A primary consideration in the cell transistor operating environment (e.g., range of conditions where the cell is reliable) is leakage current. Leakage may result in cell or product fails, excess power consumption, and/or constrained operating conditions (e.g., need for tight voltage regulation, wider spacing of components, increased redundancy, etc.).

In the cell of FIG. 1, the leakage current may occur along several paths. For example, transistor off-state (subthreshold) leakage current A may occur between drain 20 and source 30 along the channel. Junction leakage current B may occur between drain 20 and substrate (body or well) 50 induced by the substrate (body or well) bias. Gate-Induced-Drain-Leakage (GIDL) current C may also occur between drain 20 and the substrate (body or well) 50 induced by the gate bias. The performance of the DRAM array cells may thus be adversely affected if the electrical environment is not effectively controlled. Unfortunately, this control becomes more problematic with decreasing device dimensions, i.e., when channel lengthen is further reduced.

Generally, the electrical operating environment of the cell is defined by bias conditions of the transfer transistors which are selected to establish the operating window for the processes to be performed reliably by the chip circuitry during normal operation (e.g., the read, write and other operations). For example, to achieve certain word-line access speed, the word-line boost level (or $V_{pp}$) is set to have sufficient gate overdrive. On the other hand, too much overdrive will damage the gate dielectric and cause reliability concern. Also, in order to reduce the cell leakage, the negative word-line level is set properly below ground so that the transfer transistors are turned off more hardly for those non-selected word-lines. However, if biased too much, then the GIDL leakage will dominate the leakage mechanism and result in poor retention situation. Similarly, the body bias, $V_{bb}$, is also implemented to cut down the subthreshold leakage. Excessive body bias will cause junction leakage to increase and would result in unsatisfied retention.

Largely for economic reasons, the bias conditions are set during design stage and can be slightly adjusted at the wafer-level burn-in. With an array containing thousands of cells, selecting the appropriate bias conditions may be difficult due to lack of uniformity of cells across the wafer, from wafer to wafer and from lot to lot. In other words, a single set of bias conditions will be difficult to cope with non-uniform threshold voltage distribution across the wafer.

The nominal bias conditions for the cell array are typically selected based on the intended cell geometry and performance characteristics assuming all cells act the same; this assumption breaks down as arrays become larger and cell sizes (ground rules) become smaller. Thus, slight variations in the geometry or manufacturing condition across the array on the chip and/or across the wafer will cause increasingly wider variations in the electrical characteristics (e.g. threshold voltage ($V_t$) of array transfer transistor) among the cells of the array. For example, variations in the planarity of adjacent shallow trench isolation (STI) can cause array $V_t$ variations as large as 200 mV across a wafer. Variations in array $V_t$ may directly translate into degradation of the retention time for the DRAM circuit due to certain array transistors having significant transistor off-state leakage current. The increasingly wide variations in the array $V_t$, make it difficult to obtain a robust design with a fixed bias set, such as a fixed $V_{bb}$ (body bias), $V_{pp}$ (word line boost voltage), or $V_{nwll}$ (negative word line low). Thus, the yield of DRAM chips from the wafer and/or the performance of those chips may be compromised.

In the past, this problem has been addressed to some extent by various bias correction techniques to improve the retention time of memory array by optimizing the critical operating voltage conditions. Earlier approaches include tuning the body bias at the end of the product development stage, or by holding the gate of the non-active transfer devices below ground. These approaches tend to over adjust the voltage conditions, and therefore lead to negative impact to the device performance and circuit power consumption. For example, the over-correction of the substrate bias may result in failure of other cells due to increases in junction leakage at high substrate biases. Another example is that the over-adjustment of the gate bias of the non-active transfer devices below ground can also lead to fails in other cells due to increases in gate-induced drain leakage (GIDL) at high off-state gate biases as has mentioned above. Also, the monitor devices used in the past have typically provided wrongful and misleading information regarding the real product array due to mismatch between the dimensions of monitor devices used and those of the real product array.

Thus, there is a need for improved bias correction techniques and on-chip support circuits which enable improved bias control and correction to achieve improved chip operation and yield even for memory arrays on the order of 1 giga byte or higher. It would be especially desirable to provide such improvements to enable proper biasing of the chip which can be trimmed at the wafer level burn-in.

SUMMARY OF THE INVENTION

The invention provides methods and circuitry for improved bias condition selection and control for on-chip transistor arrays. The invention also provides transistor arrays devices (or cores) having improved performance using control circuitry of the invention. The invention can potentially lead to significant yield improvement for memory products employing transistor arrays.

In one aspect, the invention encompasses methods involving the use of array bias voltage correction where the amount of correction for a given bias voltage for a memory array is based on the threshold voltage of a monitor transistor, but is only a fraction of the monitor transistor threshold voltage.

In another aspect, the invention encompasses a method of regulating at least one bias voltage supplied to a transistor array, the method comprising:

(a) providing at least one monitor transistor, (b) biasing the monitor transistor(s) provided in step (a) to determine a first monitor threshold voltage, and (c) adjusting a first bias voltage by a first fraction of the first monitor threshold voltage, the first fraction being less than one.

Preferably, the transistor array is part of an array of memory cells, more preferably an array of random access memory cells (especially DRAM). Preferably, at least two bias voltages are regulated. The bias voltage(s) are preferably selected from the group consisting of $V_{bb}$, $V_{pp}$, $V_{nwll}$, $V_{blh}$ (bitline high voltage), and $V_{bleq}$ (bitline equalization voltage). The monitor transistor(s) is preferably part of a monitor cell located in the transistor array or in a monitor array adjacent to the transistor array.

In another aspect, the invention encompasses a transistor array device comprising:

(a) an array of transistors, (b) a first power supply to supply a first bias voltage to the array, (c) a first voltage regulator circuit to control the first bias voltage, (d) circuits for communicating to and from the array, and (e) a first monitor cell comprising a first monitor cell transistor, the first monitor cell transistor forming part of the first voltage regulator circuit whereby the first bias voltage is modulated by a fraction of a threshold voltage of the first monitor cell transistor, the fraction being less than one.

In another aspect, the invention provides a monitor and voltage control circuit for determining a threshold voltage of at least one monitor transistor and regulating at least one bias voltage (to be supplied to a transistor array) in response to the monitor transistor threshold voltage. The bias voltage(s) to be regulated are preferably selected from the group consisting of $V_{bb}$, $V_{pp}$, $V_{nwll}$, $V_{blh}$, and $V_{bleq}$. The monitor transistor is preferably located in a monitor cell located in the transistor array or in an array adjacent to the transistor array.

The invention further encompasses a voltage regulator circuit for regulating a voltage supplied to a transistor array, the circuit comprising:

(a) a power supply, (b) a first monitor transistor having a gate and a drain node which are connected to the power supply, (c) a first resistor having a first node connected to a source node of the first monitor transistor, (d) a differential amplifier having a first input connected to a second node of the first resistor, (e) a reference voltage source connected to a second input of the differential amplifier, (f) a charge pump having an input node connected to an output node of the differential amplifier, (g) a second monitor transistor having a gate and a drain node which are connected to the second node of the first resistor, (h) a second resistor having a first node connected to a source node of the second monitor transistor, (i) an output node connecting an output of the charge pump and a second node of the second resistor, whereby a feedback loop is formed from the output of the differential amplifier to the first input of the differential amplifier, the feedback loop including the charge pump, second resistor and second monitor transistor, and (j) an output connection from the output node to the transistor array.

These and other aspects of the invention are described in further detail below.

DETAILED DESCRIPTION OF THE INVENTION

The invention encompasses methods involving the use of array bias voltage correction where a given bias voltage for a transistor array is adjusted fractionally in response to an actual threshold voltage of a monitor device transistor. More preferably, the methods of the invention involve the use of this type of bias correction for at least two array bias voltages. The invention also encompasses voltage regulation circuits for use with power supplies to transistor arrays where the voltage regulation circuit includes at least one monitor cell transistor such that the output voltage is regulated as a function of a fraction of the monitor cell threshold voltage. The invention also encompasses transistor array devices using a power supply regulated using the methods of the invention. The invention enables the achievement of improved array transistor performance, increased operating bias condition ranges, and improved product yield for devices employing transistor arrays.

Broadly, the methods of the invention involve setting a bias condition for a transistor array by the following steps:

(a) providing at least one monitor transistor, (b) biasing the monitor transistor(s) provided in step (a) to determine a first monitor threshold voltage, and (c) adjusting a first bias voltage by a first fraction of the first monitor threshold voltage, the first fraction being less than one.

More preferably, the methods of the invention involve the setting of at least two bias voltage conditions where the methods include the additional step:

(d) adjusting a second array bias voltage by a second fraction of at least one monitor threshold voltage.

The transistor array may be any array containing numerous transistor devices operating in a similar environment. Preferably, the transistor array is an array such as would be typically used in a dynamic random access memory (DRAM) device chip or in a so-called embedded DRAM (eDRAM) device—e.g. where the memory array is incorporated as a macro to a core logic device chip. The invention is not limited to DRAM or eDRAM devices, but rather may be used wherever a transistor array device, especially any memory array is desired, for example, it can be a flash memory. A typical memory array might have on the order of at least one million transistors, more typically, about tens of millions to billions of transistors. The invention is not limited to any specific memory array configuration or method of making. For example, the invention is illustrated further below in connection with memory cells using trench capacitors, however, the invention is also useful with memory cells using stacked capacitor designs. Apart from incorporation of the structures and circuitry needed to implement the invention, methods known in the art for forming the transistor array(s) and associated devices may be used as known in the art. It should also be understood that the invention may be applied to a plurality of transistor arrays if desired.

Accurate monitoring of the device $V_t$ is important to successfully implementing the tracking scheme of the invention. Therefore, the monitor cell transistor(s) of the invention is preferably a transistor which is of similar (if not identical) construction as the transistors of the memory array. More preferably, the monitor transistor(s) are located in an environment which is similar (if not identical) to the environment of the transistors of the memory array. For example, in the case of a memory array that functions as part of a DRAM memory array, the monitor cell transistors are preferably constructed as part of DRAM memory cells in a DRAM memory cell array. If desired, the monitor cells may be placed in the actual memory array or may be placed in a monitor array adjacent to the memory array. Preferably, the monitor transistors are located in monitor cells which are in one or more monitor arrays adjacent to the memory array. The monitor transistor will have its gate and body biased substantially identically as those of the transistors in the product transistor array. Therefore, the threshold voltage monitored from the monitor transistor will reflect the threshold voltage of the transistor in the product array. The monitor array must also slightly modified so that its threshold voltage can be physically measured.

Preferably, a plurality of monitor cell transistors are provided such that at least two (or two groups of) monitor cell transistors form part of a voltage regulation circuit for a given power supply (bias) to the memory array. In this manner, the actual threshold voltages of the monitor cell transistors is used to adjust the actual power supply to the memory array. The manner in which the voltage regulation circuit is configured is preferably such that the output bias voltage as a result of application of the regulation circuit adjusts (tracks) the output voltage by a fraction (<1) of the actual monitor transistor voltage. Thus, for example, if the desired fraction were 0.5, for both bias voltages $V_{bb}$ and $V_{nwl}$, then the adjustment for a change of monitor transistor threshold voltage of 200 mV would be 100 mV correction from the $V_{bb}$ adjustment, and 100 mV correction from the $V_{nwl}$ adjustment. The exact fraction of the monitor transistor threshold voltage contributed to the voltage regulation process can be adjusted by the configuration of resistors within the circuit or by other means apparent to those of ordinary skill in the art from the contents of the present application. The desired adjustment fraction can be modified depending on the bias voltage to be supplied, the history of the product incorporating the memory array, or to achieve some other objective. For memory cell memory arrays, the fraction(s) are preferably selected to provide an improved operating range of bias conditions, reduced power consumption, reduced device stress, improved the overall retention time of the memory cells in the array, or other desirable benefits.

Figure 2:
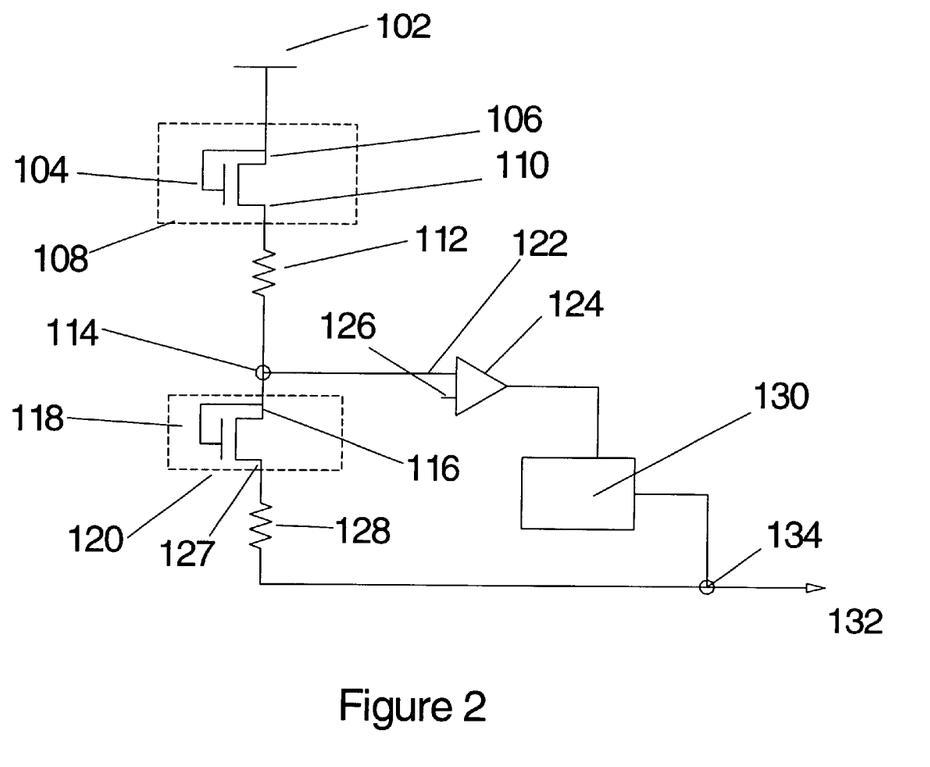
FIG. 2 shows a control circuit for adjusting an array bias voltage in response to a threshold voltage of a monitor array transistor.

Preferably, the gate of at least one of the monitor cell transistor(s) is connected to the internal power supply ($V_{int}$) or to another suitable power source. The invention is not limited to a specific voltage regulator circuit configuration. A preferred voltage regulator circuit layout is shown in FIG. 2. In the circuit layout of FIG. 2, a power source ($V_{int}$) 102 is connected to gate 104 and drain 106 of the first monitor transistor 108. The other source 110 of monitor cell 108 is connected to the first node of a first resistor ($R_1$)112. The second node of resistor 112 is connected 114 is connected to the first input 122 of a differential amplifier 124 and also to drain 116 and gate 118 of the second monitor transistor 120. A second input 126 of differential amplifier 124 120. A second input 126 of differential amplifier 124 is supplied with a reference voltage 126 ($V_{ref}$). Preferably, the reference voltage is insensitive to the voltage supply and the chip temperature. The reference voltage can be generated from a conventional band-gap reference circuit or constant voltage source. Source 127 of the second monitor device 118 is connected to the first node of a second resistor ($R_2$) 128. The second node of the second resistor 128 is connected to the output 134 from a voltage generator 130. Node 134 is also connected to a internal voltage supply of the memory array. The voltage generator is controlled by the output of the differential amplifier 124. Thus, a feed back control loop is formed from the output of differential amplifier 124 to generator 130 and back to the input of the differential amplifier 126 through the voltage regulator circuit.

Using the above circuit, the bias voltage (generically represented as $V_b$) supplied to the array would be according to equation (1) below, assuming that the transistors of the first and second monitor cells have approximately equal threshold voltages:

$$V_b=V_{ref}[(R_2/R_1)+1]+V_t[(R_2/R_1)-1]+(R_2/R_1)V_{int} \qquad (1)$$

where $V_t$ is the actual threshold voltage of the monitor transistors. $R_1$, $R_2$ and $V_{ref}$ can be selected based on initial design parameters and/or target values for the bias voltage (e.g., $V_{bb}$, $V_{pp}$, $V_{nwll}$, $V_{blh}$, and $V_{bleq}$ etc.) to be supplied. For example, in the case of $V_{bb}$, if $V_{ref}$ is kept constant, values of $R_1$, and $R_2$ can be adjusted according to α[or $R_2/R_1-1$], so that $V_{bb}$ will vary proportionally to $αV_{int}$, where α is the fraction. In this example, for $V_{int}$=2.1V, array device's nominal threshold voltage is 1.0 V, and the target $V_{bb}$ is −0.5 V. In order to get ½$V_t$ (actual) tracking, we can set $V_{ref}$ =0.95 V. HSPICE simulation software (available from Meta-Soft, Inc., Campbell, Calif.) was used to generate simulations indicating that $V_{bb}$ can track array $V_t$ to a different degree. With a modification of the resistor ratio, $V_{bb}$ variation corresponding to different fractions of $V_t$ variation can be achieved. It is most preferable that the tracking of the bias voltage to be supplied be a function of some fraction (less than one) times the actual threshold voltage of the monitor transistor, also referred to as "partial tracking" to avoid over-correction.

The advantages of partial tracking are especially apparent where at least two bias voltages are being adjusted. In order to get dual bias voltages and partial tracking, two regulator circuits as shown in FIG. 2 are needed. The first circuit is used for the first generator to adjust the first bias against the first fraction of a first monitor transistor $V_t$. Similarly, the second circuit is used for the second generator to adjust the second bias against the second fraction of a second monitor transistor $V_t$. For example, $V_{nwll}$ can be adjusted in a manner similar to the adjustment of $V_{bb}$ described above. The table below illustrates the advantages of improved retention time (i.e., reduced degradation relative to the nominal retention time of the device as designed) associated with partial tracking of at least two bias voltages (e.g., $V_{bb}$ and $V_{nwll}$) for two different values of deviation ($\Delta V_t$) from the nominal threshold voltage. The nominal $V_t$ for the array transistors in the example below is 1 V.

| Examples | Retention Time Degradation | |
|---|---|---|
| | $\Delta V_t = 100$ mV | $\Delta V_t = 200$ mV |
| Comparisons | | |
| No tracking with $V_t$ | 10X | 100X |
| Full Tracking of $V_{bb}$ with $V_t$ | 0.3X | >3X |
| Full Tracking of $V_{nwll}$ with $V_t$ | 0.4X | 3X |
| The Invention | | |
| ½ tracking of $V_{bb}$ with $V_t$ and ½ tracking of $V_{nwll}$ with $V_t$ | 0.2X | 0.7X |

Thus the invention enables: (1) accurate monitoring of the array $V_t$ (from the corresponding monitor cell transistor $V_t$, and (2) flexibility in adjusting the critical array operating bias conditions such as the substrate bias ($V_{bb}$) and the negative word line low level ($V_{nwll}$). In this way, the low fliers (failing or performance-limiting transistors/cells) due to the across-wafer or across-lot $V_t$ variations can be minimized. Retention yield on actual product can therefore be significantly improved.

The invention provides monitor and voltage control circuits for determining a threshold voltage of at least one monitor transistor and regulating at least one bias voltage (to be supplied to a transistor array) in response to the monitor transistor threshold voltage. The bias voltage(s) to be regulated are preferably selected from the group consisting of $V_{bb}$, $V_{pp}$, $V_{nwll}$, $V_{blh}$, and $V_{bleq}$. The monitor transistor is preferably located in a monitor cell located in the transistor array or in an array adjacent to the transistor array.

As with the preferred circuit of FIG. 2, preferably at least two monitor transistors are incorporated into the circuit, where one of the monitor transistors forms part of a feedback loop to the differential amplifier. Also, preferably at least two resistors are used as the resistive load where the ratio of resistance of the two resistors controls the fraction of monitor threshold voltage by which the output voltage from the circuit is controlled. While the voltage regulator circuit of the invention has been shown in a basic layout, it should be understood that the invention also encompasses more complicated layouts which basically perform the same partial tracking voltage regulation function.

Thus, the voltage regulator circuit for regulating a voltage supplied to a transistor array may be a circuit comprising:
 (a) a power supply,
 (b) a first monitor transistor having a gate and a drain node which are connected to the power supply,
 (c) a first resistor having a first node connected to a source node of the first monitor transistor,
 (d) a differential amplifier having a first input connected to a second node of the first resistor,
 (e) a reference voltage source connected to a second input of the differential amplifier,
 (f) a charge pump having an input node connected to an output node of the differential amplifier,
 (g) a second monitor transistor having a gate and a drain node which are connected to the second node of the first resistor,
 (h) a second resistor having a first node connected to a source node of the second monitor transistor,
 (i) an output node connecting an output of the charge pump and a second node of the second resistor, whereby a feedback loop is formed from the output of the differential amplifier to the first input of the differential amplifier, the feedback loop including the charge pump, second resistor and second monitor transistor, and
 (j) an output connection from the output node to the transistor array.

The invention encompasses transistor array devices comprising:
 (a) an array of transistors,
 (b) a first power supply to supply a first bias voltage to the array,
 (c) a first voltage regulator circuit to control the first bias voltage,
 (d) circuits for communicating to and from the array, and
 (e) a first monitor cell comprising a first monitor cell transistor, the first monitor cell transistor forming part of the first voltage regulator circuit whereby the first bias voltage is modulated by a fraction of a threshold voltage of the first monitor cell transistor, the fraction being less than one.

More preferably, the device includes multiple power supplies each for providing a separate bias voltage to the transistor array. Also, preferably, the device preferably includes voltage regulation circuits for at least two of the power supplies each regulation circuits preferably including at least two monitor cell transistors which enable partial tracking of the supplied voltage based on the monitor transistor threshold voltage.

Figure 3:
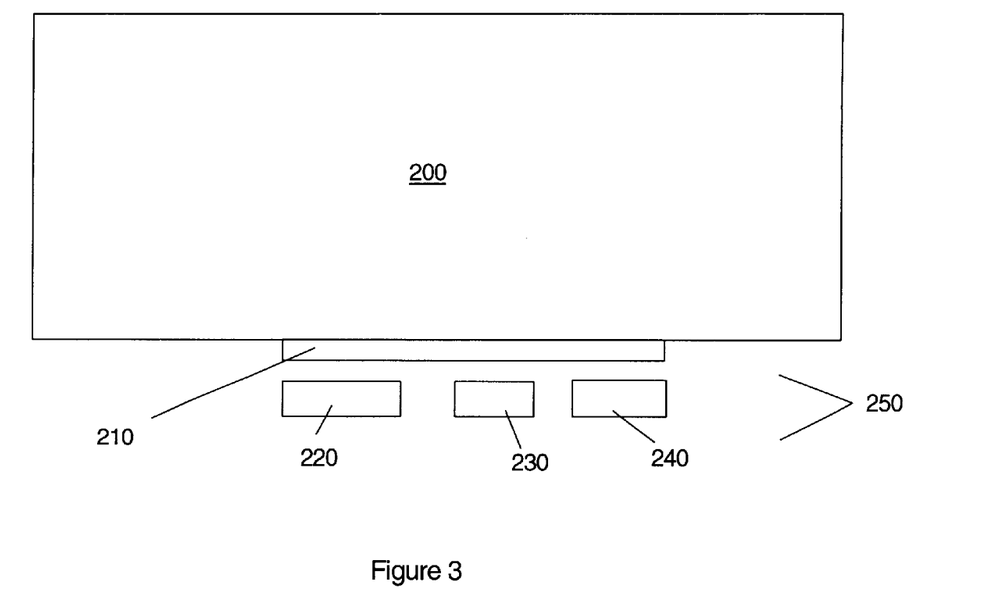
FIG. 3 is a schematic illustration of a layout of a monitor array adjacent to a memory cell array.

Referring to FIG. 3, a transistor array 200 is provided with one or more monitor transistors located in a monitor array 210 adjacent to the transistor array. In a region 250 of the chip. Also provided in region 250 are power generators which supply powers 220, 230 and 240 to provide bias voltages to array 200. The circuitry of at least one, more preferably at least two of the bias voltage supplies include connections (not shown) to transistors in monitor array 210. If desired, a plurality of monitor arrays may be employed. Also, the monitor array(s) may be located at any convenient position relative to the other design elements of the chip to manage the available chip area. It may be possible to locate the monitor cell transistors in the actual device transistor array, however, this is generally less preferable since it might force an extra design constraint on the transistor array layout.

Figure 4:
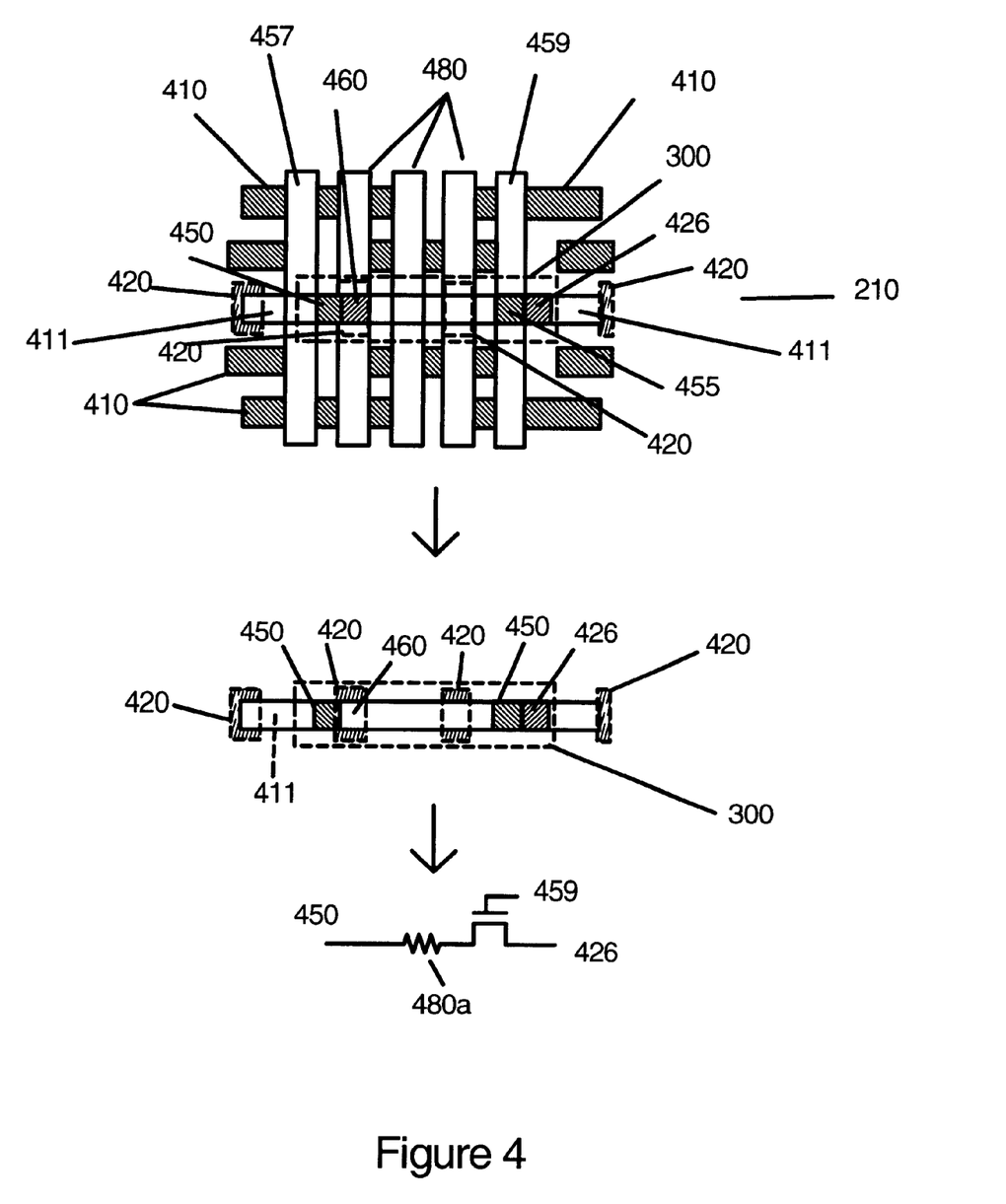
FIG. 4 is a schematic illustration of a layout of a monitor cell in a monitor array according to the invention useful in implementing the control circuit of FIG. 2.

Referring to FIG. 4, a portion of monitor array 210 is shown. Preferably, the environment of the transistors in the monitor array is as similar as possible to the transistors of the device transistor array. Thus, where the array is a bank of trench capacitor DRAM memory cells, monitor array 210 preferably contains active areas 410, word lines 457, 459, 480 and trench capacitors 420 similar to those which would be found in a trench capacitor cell DRAM memory array. If desired, monitor array 210 could also contain bit lines (not shown) and other features of a memory array as long as they did not impair the ability of the monitor transistors to function.

A monitor cell transistor 300 is formed by joining two active areas 410 to form a longer active area 411. Transistor 300 has a source/drain contact 426, gate 455 and second source/drain contact 450. Contact 450 would not be the normal location for a source/drain contact relative to gate 455 (e.g., if gate 455 were part of a DRAM memory cell), however, it becomes an effective source/drain by biasing of word lines 480 whereby gate 460 effectively becomes a conductor and the portion between gate 455 and contact 450 can be represented as an equivalent resistance 480a shown in the equivalent circuit representation at the bottom of FIG. 4. Generally, equivalent resistance 480a is considered as negligible relative to the operation of monitor transistor 300 and relative to resistors such as $R_1$ and $R_2$ of the FIG. 2 circuit.

In operation as a monitor cell such as cell 108 of FIG. 2, gate 455 and a source/drain contact 426 could be biased by connection to $V_{int}$ or other appropriate voltage source. Contact 450 would then be connected a resistor $R_1$ not shown in FIG. 4. An additional monitor cell could be configured in the monitor array to serve as monitor cell 120 of the FIG. 2 circuit. Additionally, monitor array 210 could contain additional monitor cells to act as part of the voltage regulation circuits for other bias voltage supplies to the memory array 200.

As noted previously, the invention is not limited to any specific device configuration apart from presence of the monitor transistors with suitable connection to the appropriate voltage regulation circuitry to accomplish the partial tracking of the invention.

What is claimed is:

1. A method of regulating at least one bias voltage supplied to a transistor array, said method comprising:
   (a) providing at least one monitor transistor,
   (b) biasing the monitor transistor(s) provided in step (a) to determine a first monitor threshold voltage, and
   (c) adjusting a first bias voltage by a first fraction of said first monitor threshold voltage, said first fraction being less than one.

2. The method of claim 1 wherein a first plurality of monitor transistors is supplied in step (a).

3. The method of claim 1 further comprising:
   (d) providing at least one additional monitor transistor,
   (e) biasing the additional monitor transistor(s) provided in step (d) to determine a second monitor threshold voltage, and
   (f) adjusting a second bias voltage by a second fraction of said second monitor threshold voltage, said second fraction being less than one.

4. The method of claim 1 wherein said first fraction is about 0.4 to 0.6.

5. The method of claim 4 wherein said first fraction is about 0.5.

6. The method of claim 3 wherein said first and second fractions total to about 0.9 to 1.1.

7. The method of claim 6 wherein said fractions total to about 1.0.

8. The method of claim 1 wherein said first fraction is determined by a ratio of two resistor values.

9. The method of claim 1 wherein said bias voltage is selected from the group consisting of a body bias, boost word-line bias, negative-word-line-low bias, the bit-line high bias, and bit-line low bias.

10. The method of claim 1 wherein said adjusting step (c) includes:
    providing a voltage regulation circuit for supplying said first bias voltage to said array, said circuit including a differential amplifier and a charge pump, wherein said differential amplifier receives said first monitor threshold voltage as an input and controls the operation of said charge pump.

11. The method of claim 10 wherein said adjusting step (c) further comprises providing a reference voltage as a second input to said differential amplifier.

12. The method of claim 11 wherein said reference voltage is provided from a a band-gap reference circuit.

13. The method of claim 1 wherein said transistor array is a DRAM array.

14. The method of claim 1 wherein transistor array is an embedded DRAM array.

15. A transistor array device comprising:
    (a) an array of transistors,
    (b) a first power supply to supply a first bias voltage to said array,
    (c) a first voltage regulator circuit to control said first bias voltage,
    (d) circuits for communicating to and from said array, and
    (e) a first monitor cell comprising a first monitor cell transistor, said first monitor cell transistor forming part of said first voltage regulator circuit whereby said first bias voltage is modulated by a fraction of a threshold voltage of said first monitor cell transistor, said fraction being less than one.

16. The transistor array device of claim 15 comprising a first plurality of monitor transistors including said first monitor cell transistor wherein at least two of said first plurality of monitor transistors form part of first said voltage regulator circuit.

17. The transistor array device of claim 15 further comprising:
    (f) a second voltage regulator circuit to control a second bias voltage to be supplied to said array, and
    (g) a second monitor cell comprising a second monitor cell transistor, said second monitor cell transistor forming part of said second voltage regulator circuit whereby said second bias voltage is modulated by a second fraction of a threshold voltage of said second monitor cell transistor, said second fraction being less than one.

18. The transistor array device of claim 17 comprising first and second pluralities of monitor transistors said pluralities respectively including said first and second monitor cell transistors wherein at least two of said first plurality of monitor transistors form part of said first voltage regulator circuit, and at least two of said second plurality of monitor transistors form part of said second voltage regulator circuit.

19. The transistor array device of claim 15 wherein said transistors of said array are part of a memory cell array.

20. The transistor array device of claim 15 wherein said first monitor transistor has a threshold voltage which is representative of a threshold voltage of said transistors of said array.

21. The transistor array device of claim 19 wherein said first monitor transistor is connected to at least one storage capacitor.

22. The transistor array device of claim 15 wherein said first monitor transistor is located in said transistor array.

23. The transistor array device of claim 15 wherein said first monitor transistor is located in a monitor array adjacent to said transistor array.

24. A voltage regulator circuit for regulating a voltage supplied to a transistor array, said regulator circuit comprising:
    (a) a power supply,
    (b) a first monitor transistor having a gate and a drain node which are connected to said power supply,
    (c) a first resistor having a first node connected to a source node of said first monitor transistor,
    (d) a differential amplifier having a first input connected to a second node of said first resistor, (e) a reference voltage source connected to a second input of said differential amplifier, (f) a charge pump having an input node connected to an output node of said differential amplifier, (g) a second monitor transistor having a gate and a drain node which are connected to said second node of said first resistor, (h) a second resistor having a first node connected to a source node of said second monitor transistor, (i) an output node connecting an output of said charge pump and a second node of said second resistor, whereby a feedback loop is formed from the output of said differential amplifier to said first input of said differential amplifier, said feedback loop including said charge pump, second resistor and second monitor transistor, and (j) an output connection from said output node to said transistor array.

25. The voltage regulator circuit of claim 24 wherein said monitor transistors are located in a memory cell array.

26. The voltage regulator circuit of claim 24 wherein said monitor transistors have a threshold voltage which is representative of a threshold voltage of said transistors of said array.

27. The voltage regulator circuit of claim 24 wherein each of said monitor transistors is connected to at least one storage capacitor.

28. The voltage regulator circuit of claim 24 wherein said monitor transistors are located in said transistor array.

29. The voltage regulator circuit of claim 24 wherein said monitor transistors are located in a monitor array adjacent to said transistor array.

* * * * *

UNITED STATES PATENT AND TRADEMARK OFFICE
CERTIFICATE OF CORRECTION

PATENT NO. : 6,252,806 B1
DATED : June 26, 2001
INVENTOR(S) : Wayne F. Ellis et al.

Page 1 of 1

It is certified that error appears in the above-identified patent and that said Letters Patent is hereby corrected as shown below:

<u>Title page,</u>
Item [75] Inventor, "Yujon Li" should read -- Yujun Li --.
Item [12], "Ellis et al" should read -- Li et al --.
Item [75] Inventors should be listed -- Yujun Li, Poughkeepsie, NY; Wayne F. Ellis, Jericho, VT; Louis L. Hsu, Fishkill, NY; Brian L. Ji, Fishkill, NY; Oliver Weinfurtner, Wappingers Falls, NY --.

Signed and Sealed this

Twenty-sixth Day of March, 2002

*Attest:*

JAMES E. ROGAN
*Attesting Officer*     *Director of the United States Patent and Trademark Office*